United States Patent
Tanwongwan et al.

(10) Patent No.: US 10,847,385 B2
(45) Date of Patent: Nov. 24, 2020

(54) GLOB TOP ENCAPSULATION USING MOLDING TAPE

(71) Applicant: NXP B.V., Eindhoven (NL)

(72) Inventors: Wiwat Tanwongwan, Chatuchak (TH); Amornthep Saiyajitara, Bangken (TH); Nathapop Lappanitpullpol, Pathumthanee (TH)

(73) Assignee: NXP B.V., Eindhoven (NL)

( * ) Notice: Subject to any disclaimer, the term of this patent is extended or adjusted under 35 U.S.C. 154(b) by 172 days.

(21) Appl. No.: 16/155,856

(22) Filed: Oct. 9, 2018

(65) Prior Publication Data

US 2020/0111685 A1    Apr. 9, 2020

(51) Int. Cl.
| | |
|---|---|
| *H01L 23/31* | (2006.01) |
| *H01L 21/56* | (2006.01) |
| *H01L 23/495* | (2006.01) |
| *G06K 19/077* | (2006.01) |
| *H01L 23/498* | (2006.01) |
| *H01L 21/48* | (2006.01) |

(52) U.S. Cl.
CPC ...... *H01L 21/568* (2013.01); *G06K 19/07724* (2013.01); *H01L 21/4825* (2013.01); *H01L 21/4839* (2013.01); *H01L 21/565* (2013.01); *H01L 23/3107* (2013.01); *H01L 23/4952* (2013.01); *H01L 23/49503* (2013.01); *H01L 23/49541* (2013.01); *H01L 23/49855* (2013.01); *H01L 23/49861* (2013.01)

(58) Field of Classification Search
None
See application file for complete search history.

(56) References Cited

U.S. PATENT DOCUMENTS

| | | |
|---|---|---|
| 5,583,370 A | 12/1996 | Higgens, III |
| 5,766,987 A | 6/1998 | Mitchell et al. |
| 5,936,310 A | 8/1999 | Wensel et al. |
| 5,989,941 A | 11/1999 | Wensel |
| 6,043,146 A | 3/2000 | Watanabe |
| 6,399,425 B1 | 6/2002 | Brand et al. |
| 6,455,354 B1 | 9/2002 | Jiang |
| 6,541,872 B1 | 4/2003 | Schrock et al. |
| 2002/0129973 A1* | 9/2002 | James ............ H01L 21/565 174/260 |
| 2003/0042617 A1* | 3/2003 | Lee .............. H01L 21/563 257/778 |
| 2003/0148557 A1* | 8/2003 | Lim ............. H01L 29/0657 438/127 |
| 2011/0059579 A1 | 3/2011 | Eu et al. |
| 2012/0193802 A1 | 8/2012 | Chiu et al. |

* cited by examiner

*Primary Examiner* — Lex H Malsawma

(57) ABSTRACT

A lead frame used to assemble a semiconductor device, such as a smart card, has a first major surface including exposed leads and a second major surface including a die receiving area and one or more connection pads surrounding the die receiving area. The connection pads enable electrical connection of an Integrated Circuit (IC) die to the exposed leads. A molding tape sized and shaped like the lead frame is adhered to and covers the second major surface of the lead frame. The molding tape has a die receiving area cut-out that exposes the die receiving area and the connection pads on the second major surface of the lead frame and forms a cavity for receiving an encapsulant. The cut-out has an elevated sidewall for retaining the encapsulant within the cavity.

15 Claims, 5 Drawing Sheets

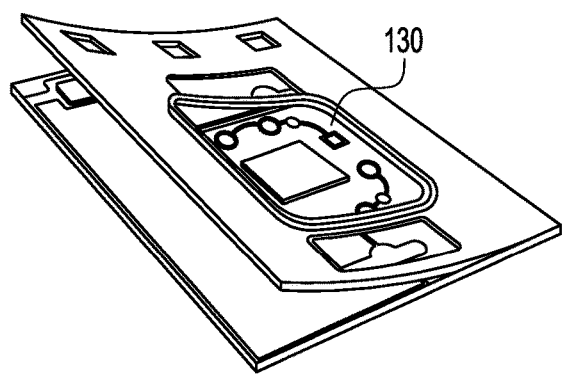
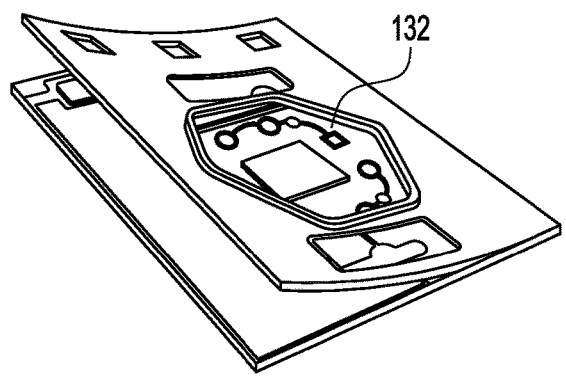
FIG. 5A  FIG. 5B
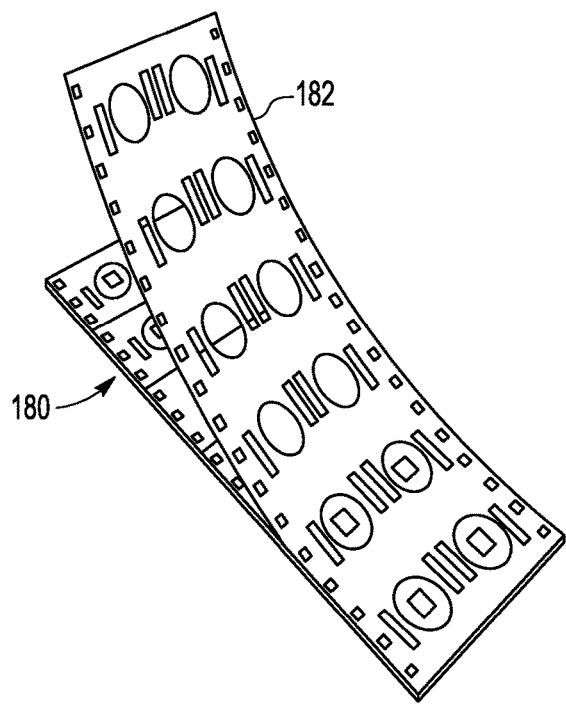
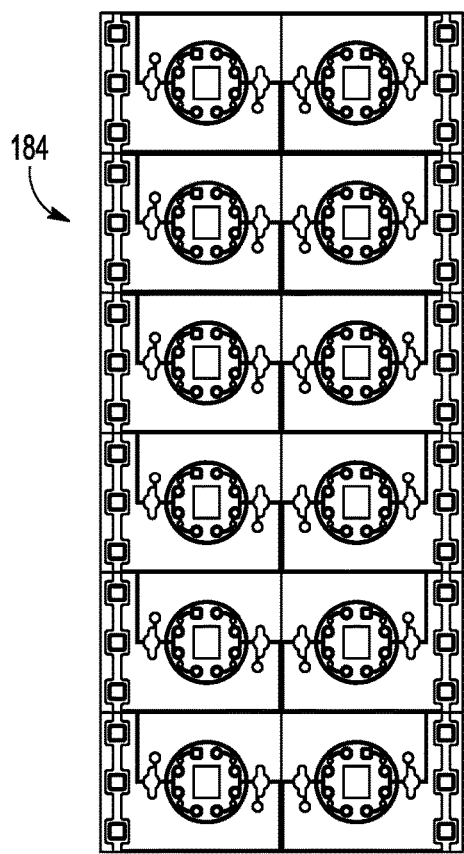
FIG. 7A  FIG. 7B

GLOB TOP ENCAPSULATION USING MOLDING TAPE

BACKGROUND

The present invention relates generally to techniques for assembling integrated circuit (IC) devices and, more particularly, to techniques performing a molding or encapsulating process in IC device assembly.

Encapsulation is a standard semiconductor process used to provide physical, chemical, and electrical protection to an IC die. Typically, the encapsulation process covers the entire surface of the die as well as any electrical connections to the die. One encapsulation process commonly used for smart card assembly, for example, is glob top molding, which is an inexpensive and easily automated process. In glob top molding, there is a single resin glob top process and a two-resin, "Dam and Fill" process. In the single resin process, a thixotropic glob top material is dispensed over the die and wirebonds and cured, while in the dam and fill process, a highly thixotropic "dam" material is dispensed around the area to be encapsulated and then the "dam" is filled with a lower viscosity material that covers the die and wirebonds.

FIG. 1A is a top plan view of a conventional lead frame 10 used in smart card assembly. The lead frame 10 has a first side with exposed metal contacts 12. FIG. 1B is a bottom view of the lead frame 10, which has an epoxy surface 14, conductive traces that form an antenna 16 and holes 18 that are used to provide a path to the metal contacts 12. There also is a die receiving area 20 located within an area defined by the holes 10. FIG. 1C shows the bottom side of the lead frame 10 after a die has been attached and electrically connected to the contacts 12 with bond wires and then covered with an encapsulant 22. However, as can be seen, after dispensing, the size and shape of the glob top material, i.e., the encapsulant 22 has not been controlled very well, and as shown in the inset, one of the bond wires 24 is exposed.

Both the single resin and two resin glob top processes often encounter problems like the one shown in FIG. 1C, where the size and shape of the glob top is not uniform or well controlled, because the low viscosity resin material is not easy to control. Some other issues encountered are incomplete glob top, exposed die, exposed wire, glob top dimensions do not conform to package outline specifications, and the glob top may be offset.

Accordingly, it would be advantageous to have an improved glop top encapsulation process that overcomes the above-listed defects.

BRIEF DESCRIPTION OF THE DRAWINGS

Embodiments of the invention will become more fully apparent from the following detailed description, the appended claims, and the accompanying drawings in which like reference numerals identify similar or identical elements.

FIGS. 5A and 5B also illustrate alternative embodiments of a piece of tape used in a glob top molding process in accordance with the present invention;

FIGS. 7A and 7B illustrate a strip of lead frames including a molding tape in accordance with an embodiment of the present invention.

DETAILED DESCRIPTION

Figure 1A:
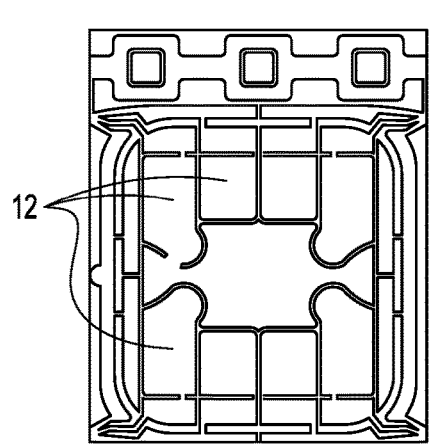
FIG. 1A is a top plan view of a conventional lead frame used in smart card assembly.

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention is a lead frame having a first major surface with a plurality of exposed contacts and a second major surface having a die receiving area and one or more connection pads surrounding the die receiving area. The connection pads enable electrical connection of an Integrated Circuit (IC) die to the exposed contacts. A molding tape sized and shaped like the lead frame is adhered to and covers the second major surface of the lead frame. There is a die receiving area cut-out in the molding tape that exposes the die receiving area and the connection pads on the second major surface of the lead frame and forms a cavity for receiving an encapsulant. The cut-out includes an elevated sidewall for retaining the encapsulant within the cavity.

In another embodiment, the present invention is a smart card comprising a lead frame, a molding tape, an IC die and an encapsulant. The lead frame has a first major surface with a plurality of exposed contacts and a second major surface having a die receiving area and one or more connection pads surrounding the die receiving area. The connection pads enable electrical connection of the IC die to the exposed contacts. The molding tape is sized and shaped like the lead frame, and is adhered to and covers the second major surface of the lead frame. The molding tape includes a die receiving area cut-out that exposes the die receiving area and the connection pads on the second major surface of the lead frame and forms a cavity for receiving an encapsulant. The cut-out includes an elevated sidewall for retaining the encapsulant within the cavity. The IC die is attached to the die receiving area and bonding pads on an upper surface of the IC die are electrically connected with respective ones of the connection pads using bond wires such that the IC die is electrically connected to the exposed contacts. The encapsulant is dispensed within the cavity and covers the IC die and the bond wires and thereby forms a glob top. The elevated sidewall prevents the encapsulant from spilling out of the cavity and onto the second major surface of the lead frame.

In yet another embodiment, the present invention provides a method of assembling a smart card. The method includes attaching an IC die to a die receiving area of a lead frame, where the lead frame has a first major surface with a plurality of exposed contacts and a second major surface having the die receiving area and one or more connection pads surrounding the die receiving area. The connection pads enable electrical connection of the IC die to the exposed contacts. A molding tape sized and shaped like the lead frame is adhered to and covers the second major surface of the lead frame. The molding tape includes a die receiving area cut-out that exposes the die receiving area and the connection pads on the second major surface of the lead frame and forms a cavity for receiving an encapsulant. The cut-out includes an elevated sidewall for retaining the encapsulant within the cavity. The method further includes electrically connecting the IC die with the exposed contacts by way of the connection pads and dispensing a liquid encapsulant into the cavity such that the encapsulant covers the IC die and the electrical connections of the IC die to the connection pads.

Figure 1B:
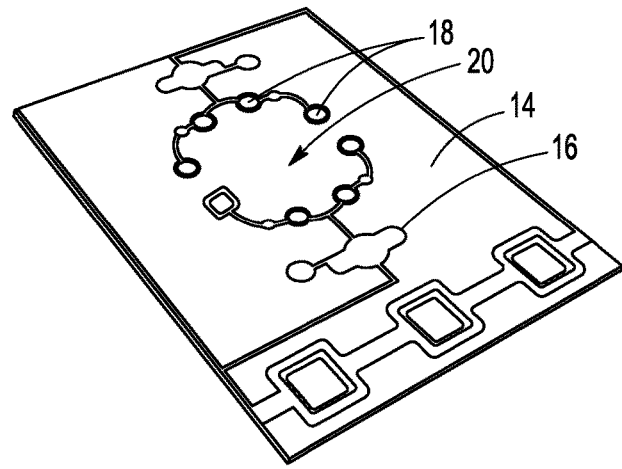
FIG. 1B is a bottom plan view of the lead frame of FIG. 1.
Figure 1C:
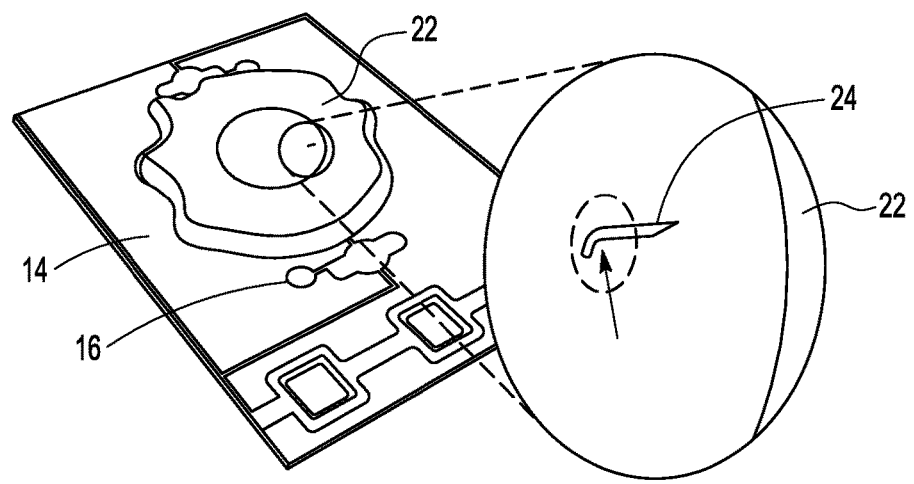
FIG. 1C is an illustration of the lead frame of FIGS. 1 and 2 after an encapsulation process.
Figure 2A:
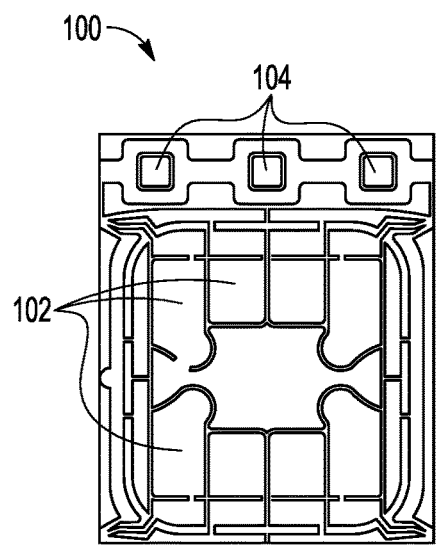
FIG. 2A is a top plan view of a lead frame used in smart card assembly in accordance with an embodiment of the present invention.
Figure 2B:
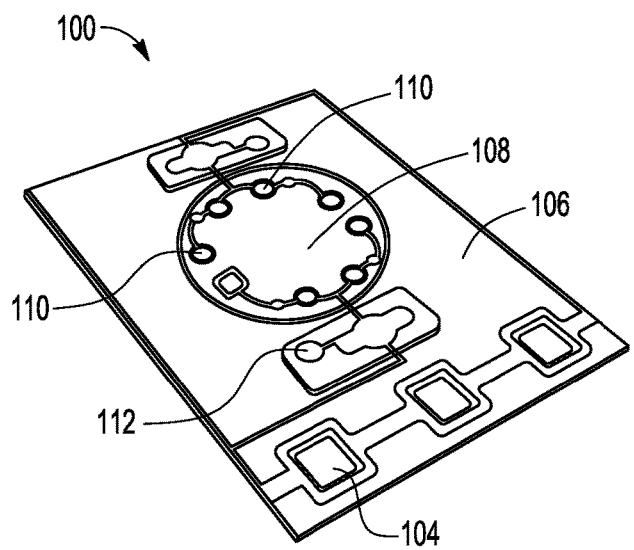
FIG. 2B is a bottom view of the lead frame of FIG. 2A.

Referring now to FIGS. 2A and 2B, top and bottom views of a lead frame assembly 100 in accordance with an embodiment of the present invention are shown. The lead frame assembly 100 includes a lead frame, such as the lead frame 10 shown in FIGS. 1A and 1B, and a molding tape. FIG. 2A shows a contact side of the lead frame assembly 100. The contact side comprises a first major surface of the assembly 100 and has a plurality of exposed contacts 102. The lead frame and lead frame assembly 100 also have a plurality of holes 104 that are used to position the lead frame and lead frame assembly during processes such as die attach and wire bonding.

FIG. 2B shows an encapsulation side of the lead frame assembly 100, which is a second major surface of the lead frame like the conventional lead frame 10 shown in FIG. 1B except that here, the second major surface is covered with a molding tape 106. The molding tape 106, which is sized and shaped like the lead frame, has an adhesive on one side such that it adheres to the second major surface of the lead frame. The molding tape 106 includes a die receiving area cut-out that exposes a die receiving area 108 and connection pads 110 on the second major surface of the lead frame. The die receiving area cut-out also forms a cavity for receiving an encapsulant, as will be discussed in more detail below. Also, as will be discussed in more detail below, the die receiving area cut-out includes an elevated sidewall for retaining the encapsulant within the cavity.

The connection pads 110 enable electrical connection of an IC die to the exposed contacts 102 on the contact side of the lead frame. In some embodiments, the lead frame includes an antenna 112 and in such embodiment, the molding tape 106 includes another cut-out to expose the antenna.

The lead frame may be a multi-layer lead frame, for instance, comprising a layer of conductive metal, one or more layers of non-conductive material, and conductive metal traces. In the lead frame assembly 100, the first major surface comprises exposed conductive metal and the second major surface comprises a non-conductive material, such as epoxy resin and/or epoxy glass. The conductive metal typically comprises Copper that is plated with other metals such as Nickel, Gold and/or Palladium.

Figure 2C:
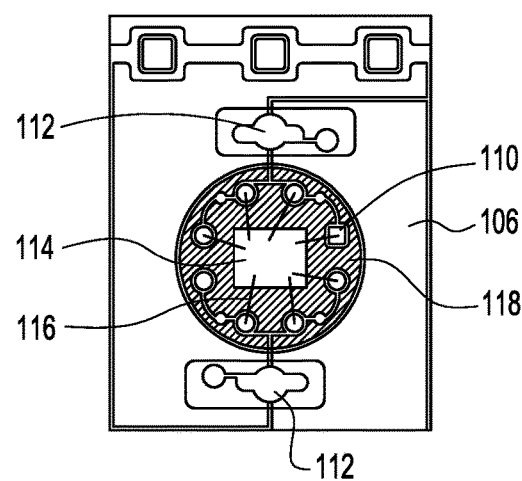
FIG. 2C is a top plan view of a partially assembled smart card in accordance with an embodiment of the present invention.

FIG. 2C shows an IC die 114 attached to the die receiving area 108 and electrically connected to the connection pads 110 with bond wires 116, such that the die 114 is in electrical communication with the exposed contacts 102. An encapsulant 118, which is dispensed within the cavity, covers the IC die 114 and the bond wires 116 and forms a glob top. In the drawings, the encapsulant 118 is shown as transparent, but this is just so that the underlying components of the assembly may be visualized. The encapsulant 118 typically is non-transparent. The elevated sidewall of the cut-out prevents the encapsulant 118 from spilling out of the cavity and onto the second major surface of the lead frame.

Figure 3A:
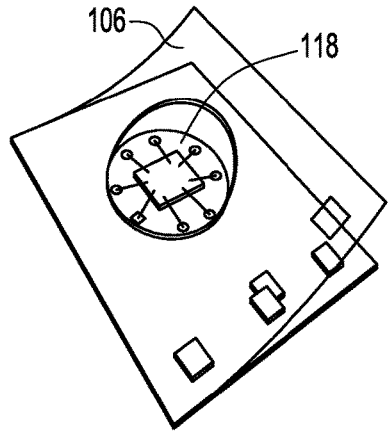
FIG. 3A illustrates how a piece of tape of the present invention relates to a lead frame.
Figure 3B:
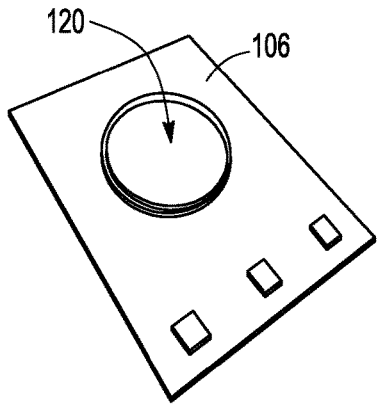
FIG. 3B illustrates the piece of tape used to assemble a smart card in accordance with an embodiment of the present invention.

FIG. 3A shows the molding tape 106 being peeled off the encapsulation side of the assembly 100 and FIG. 3B shows just the molding tape 106. In the embodiment shown in FIGS. 3A and 3B, the lead frame does not include an antenna, so the molding tape does not include a corresponding cut-out for an antenna. Thus, in this embodiment, the molding tape 106 includes a die receiving area cut-out 120 and a cut-out sidewall 122. In FIG. 3A, it can be seen that the placement of the encapsulant 118 is controlled by the molding tape 106, with the molding tape 106 preventing the encapsulant 118 from spilling onto the second major surface of the lead frame.

Figure 3C:
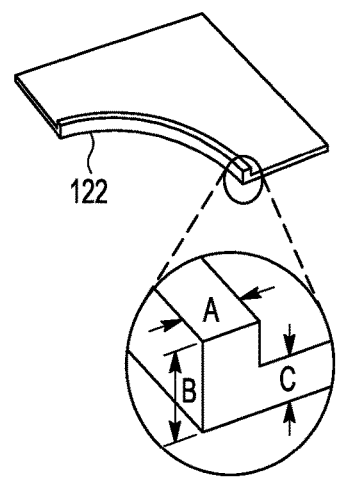
FIG. 3C is a greatly enlarged view of a portion of the piece of tape of FIG. 3A.

FIG. 3C is a greatly enlarged view of the elevated sidewall 122, which in this embodiment, is shown in the inset to be L-shaped cross-section. The molding tape 106 has a first height labeled C, the sidewall has a second height labeled B, and the sidewall has a thickness labeled A. In the presently preferred embodiment, the second height B is about twice the first height C, and twice the thickness A. In one example, the first height C is 0.05 mm or greater, the second height B is 0.1 mm or greater, and the thickness A is 0.05 mm or greater.

Figure 4A:
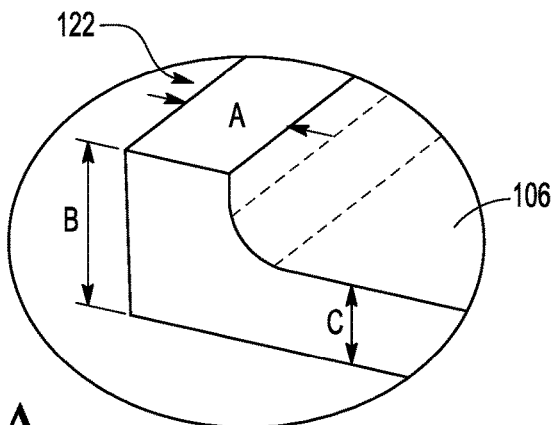
FIGS. 4A, 4B and 4C illustrate various alternative embodiments of the piece of tape of FIG. 3B.
Figure 4B:
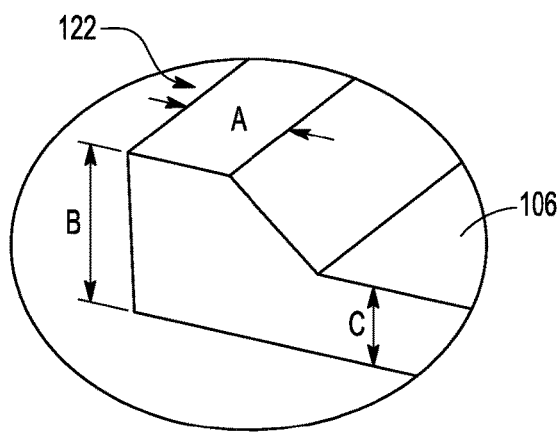
Figure 4C:
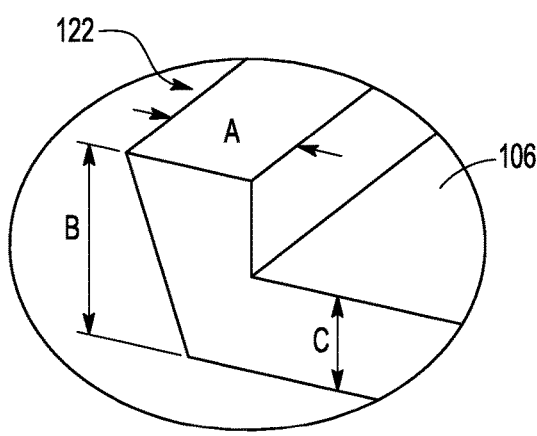

FIGS. 4A, 4B and 4C show alternative embodiments of the sidewall 122. In FIG. 4A, the angle formed where the sidewall 122 meets the body of the tape is curved or beveled instead of at 90°. In FIG. 4B, the angle formed where the sidewall 122 meets the body of the tape is greater than 90°, such that there is a slope between the sidewall and the main body of the tape. In FIG. 4C, although the angle formed where the sidewall 122 meets the body of the tape is around 90°, the inner part of the sidewall 122 that is exposed at the cavity is angled such that where the tape 106 meets the encapsulation side of the lead frame near to the die receiving area has an acute angle. In other words, an inner wall of the molding tape that defines the cavity is slanted.

FIGS. 5A and 5B are perspective views of lead frames with a molding tape partially peeled away (for ease of understanding the invention), where in FIG. 5A the die receiving area cut-out 130 is rectangular and in FIG. 5B the die receiving area cut-out 132 is hexagonal. It should be apparent that the molding tape is used to control the encapsulation shape and size on the encapsulation side of the lead frame.

Figure 6:
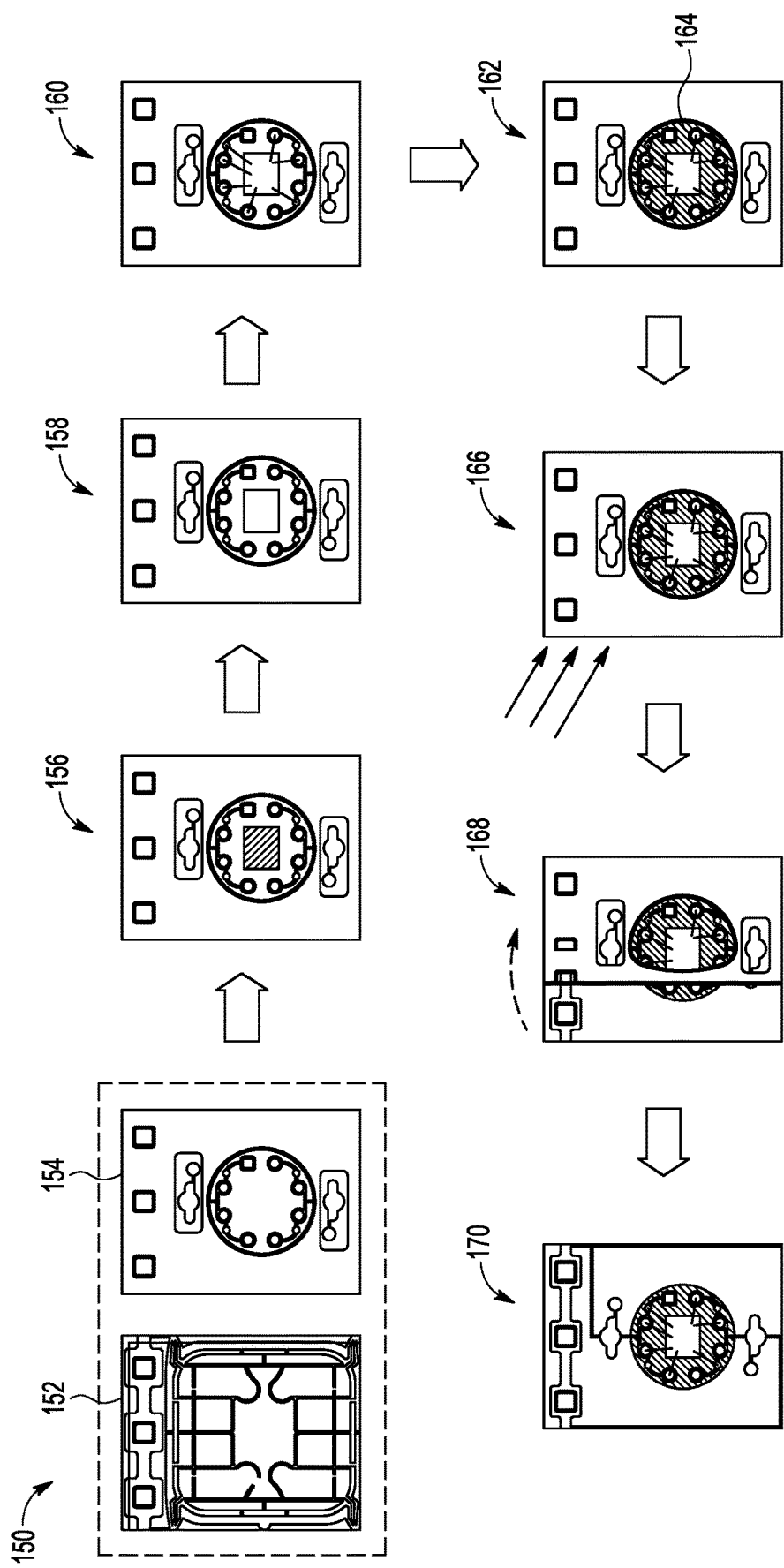
FIG. 6 illustrates steps in a smart card assembly process in accordance with an embodiment of the present invention.

FIG. 6 illustrates a method of assembling a smart card in accordance with an embodiment of the present invention. Starting at the upper left side of FIG. 6, in a first step 150, a lead frame for assembling a smart card is provided. The lead frame is similar to a conventional smart card lead frame and has a first side 152 with exposed contacts and a second, encapsulation side, except that the encapsulation side is covered with a molding tape 154. The molding tape 154 is sized and shaped like the lead frame and is adhered to and covers the second major surface of the lead frame. The molding tape 154 includes a die receiving area cut-out that exposes the die receiving area and the connection pads on the second major surface of the lead frame and forms a cavity for receiving an encapsulant. The cut-out includes an elevated sidewall for retaining the encapsulant within the cavity. In one embodiment, the tape is applied to the lead frame by a lead frame supplier when the lead frame is manufactured.

At step 156, an adhesive or die attach film (DAF) is placed in the die receiving area on the encapsulation side of the lead frame, and at step 158 a die is attached in the die receiving area using the adhesive or DAF. The adhesive is cured so that the die is securely attached to the lead frame. At step 160, the die is electrically connected to the connection pads on the lead frame. In the presently preferred embodiment, a standard wire bonding process is used to attach bond wires to die bonding pads and respective lead frame connection pads. At step 162, a glob top encapsulation process is performed whereby a liquid encapsulant 164 is dispensed into the cavity such that the encapsulant covers the IC die and the electrical connections (i.e., the bond wires) of the IC die to the connection pads. The encapsulant 164 is retained within the cavity by the elevated sidewalls so that the encapsulant does not spill over onto the second major surface of the lead frame. At step 168, which is optional, the molding tape may be removed. That is, the tape can be removed when the encapsulation material is completely cured. The tape can be removed by a peeling tape machine, which is a conventional device well known by those of skill in the art in semiconductor device assembly. Of course, the tape also could be removed other ways, such as manually. Finally, at step 170, a finished device is expected.

FIG. 7A is a perspective view of a lead frame strip 180 with a molding tape 182 adhered to one side of the lead frame strip, and FIG. 7B is a top plan view of a lead frame strip 184 that comprises the lead frame strip 180 and the molding tape 182. Thus, it will be apparent to those of skill in the art that the invention is practiced on multiple lead frames simultaneously.

As will be apparent to those of skill in the art, the concept of the present invention is to attach a molding tape with guiding holes and a cavity with elevated sidewalls to control better either a single or two-resin glob top encapsulation operation to better control the resulting size and shape of the glob top. In one embodiment, the molding tape is removed after temperature and UV curing. It will be understood by those of skill in the art that the size and shape of the tape can vary depending on the size and shape of the lead frame and the die(s) to be attached to the lead frame. Use of the tape allows low viscosity or liquid materials to be applied to a smartcard package, or other types of packages, such as MEMS packages. The molding tape is sized to conform to the outline of the finished package.

The molding tape allows for vastly improved shape, size and thickness for glob top encapsulation. The cut-out may be circular, rectangular, triangular or even a complex shape for a desired glob top process.

Unless explicitly stated otherwise, each numerical value and range should be interpreted as being approximate as if the word "about" or "approximately" preceded the value or range.

It will be further understood that various changes in the details, materials, and arrangements of the parts that have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An article of manufacture, comprising:
    a lead frame having a first major surface with a plurality of exposed contacts and a second major surface having a die receiving area and one or more connection pads surrounding the die receiving area, wherein the connection pads enable electrical connection of an Integrated Circuit (IC) die to the exposed contacts; and
    a molding tape sized and shaped like the lead frame, wherein the molding tape is adhered to the second major surface of the lead frame and covers said second major surface,
    wherein the molding tape includes a die receiving area cut-out that exposes the die receiving area and the connection pads on the second major surface of the lead frame and forms a cavity for receiving an encapsulant that covers the die and the connection pads within the cavity, and
    wherein the cut-out includes an elevated sidewall for retaining the encapsulant within the cavity, wherein the molding tape has a first height above the second major surface and the elevated sidewall has a second height above the second major surface, wherein the second height is higher than the first height.

2. The article of claim 1, further comprising:
    an IC die attached to the die receiving area; and
    a plurality of bond wires electrically connecting bonding pads on an upper surface of the IC die with respective one of the connection pads such that the IC die is electrically connected to the exposed contacts.

3. The article of claim 2, further comprising the encapsulant dispensed within the cavity and covering the IC die and the bond wires and thereby forming a glob top, wherein the elevated sidewall prevents the encapsulant from spilling out of the cavity and onto the second major surface of the leadframe.

4. The article of claim 1, wherein the cavity is ring shaped.

5. The article of claim 1, wherein the cavity is one of ring shaped, rectangular, and hexagonal.

6. The article of claim 1, wherein the elevated sidewall has an L-shaped cross-section.

7. The article of claim 6, wherein the second height is about twice the first height.

8. The article of claim 7, wherein a thickness of the sidewall is about the same as the first height.

9. The article of claim 6, wherein an angle formed where an outer side surface of the sidewall meets an exposed upper surface of the molding tape is beveled.

10. The article of claim 6, wherein an angle formed where an outer side surface of the sidewall meets an exposed upper surface of the molding tape is greater than 90°.

11. The article of claim 6, wherein an inner wall of the molding that defines the cavity is slanted.

12. The article of claim 11, wherein the angle formed where the inner wall of the molding tapes meets the second major surface of the lead frame is less than 90°.

13. A smart card, comprising:
- a lead frame having a first major surface with a plurality of exposed contacts and a second major surface having a die receiving area and one or more connection pads surrounding the die receiving area, wherein the connection pads enable electrical connection of an Integrated Circuit (IC) die to the exposed contacts;
- a molding tape sized and shaped like the lead frame, wherein the molding tape is adhered to the second major surface of the lead frame and covers said second major surface,
- wherein the molding tape includes a die receiving area cut-out that exposes the die receiving area and the connection pads on the second major surface of the lead frame and forms a cavity for receiving an encapsulant, and
- wherein the cut-out includes an elevated sidewall for retaining the encapsulant within the cavity, wherein the molding tape has a first height above the second major surface and the elevated sidewall has a second height above the second major surface, wherein the second height is higher than the first height, an IC die attached to the die receiving area;
- a plurality of bond wires electrically connecting bonding pads on an upper surface of the IC die with respective one of the connection pads such that the IC die is electrically connected to the exposed contacts; and
- the encapsulant dispensed within the cavity and covering the IC die and the bond wires and thereby forming a glob top, wherein the elevated sidewall prevents the encapsulant from spilling out of the cavity and onto the second major surface of the lead frame.

14. The smart card of claim 13, wherein the cavity is ring shaped and the elevated sidewall has an L-shaped cross-section.

15. The smartcard of claim 14, wherein the second height is about twice the first height.

* * * * *